United States Patent
Wu et al.

(10) Patent No.: US 7,180,097 B2
(45) Date of Patent: *Feb. 20, 2007

(54) HIGH-BRIGHTNESS GALLIUM-NITRIDE BASED LIGHT EMITTING DIODE STRUCTURE

(75) Inventors: Liang-Wen Wu, Banciao (TW); Ru-Chin Tu, Tainan (TW); Cheng-Tsang Yu, Wufong Township, Taichung County (TW); Tzu-Chi Wen, Tainan (TW); Fen-Ren Chien, Yonghe (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 210 days.

This patent is subject to a terminal disclaimer.

(21) Appl. No.: 10/987,518

(22) Filed: Nov. 12, 2004

(65) Prior Publication Data

US 2006/0102930 A1    May 18, 2006

(51) Int. Cl.
*H01L 27/15*    (2006.01)
*H01L 31/12*    (2006.01)
(52) U.S. Cl. .......................... 257/79; 257/85; 257/194
(58) Field of Classification Search .................. 257/79, 257/85, 97, 189, 194
See application file for complete search history.

(56) References Cited

U.S. PATENT DOCUMENTS

| 6,847,046 B1 * | 1/2005 | Wei et al. ..................... 257/15 |
| 7,049,638 B2 * | 5/2006 | Wu et al. ..................... 257/97 |
| 2006/0102921 A1 * | 5/2006 | Wu et al. ..................... 257/99 |

* cited by examiner

Primary Examiner—Theresa T. Doan

(57) ABSTRACT

A GaN-based LED structure is provided so that the brightness and lighting efficiency of the GaN-based LED are enhanced effectively. The greatest difference between the GaN-based LEDs according to the invention and the prior arts lies in the addition of a thin layer on top of the p-type contact layer within the traditional structure. The thin layer could be formed using silicon-nitride (SiN), or it could have a superlattice structure made of either SiN and undoped indium-gallium-nitride (InGaN), or SiN and undoped aluminum-gallium-indium-nitride (AlGaInN), respectively. Because of the use of SiN in the thin layer, the surfaces of the GaN-based LEDs would be micro-roughened, and the total internal reflection resulted from the GaN-based LEDs' higher index of refraction than the atmosphere could be avoided. The GaN-based LEDs according to the invention therefore have superior external quantum efficiency and lighting efficiency.

4 Claims, 4 Drawing Sheets

HIGH-BRIGHTNESS GALLIUM-NITRIDE BASED LIGHT EMITTING DIODE STRUCTURE

BACKGROUND OF THE INVENTION

1. Field of the Invention

The present invention generally relates to gallium—nitride based light emitting diodes and, more particularly, to the high-brightness gallium—nitride based light emitting diodes having micro-roughened surfaces.

2. The Prior Arts

Gallium—nitride (GaN) based light-emitting diodes (LEDs), as various color LEDs can be developed by controlling the GaN-based material's composition, has been the research and development focus in the academic arena and in the industries as well in recent years. One of the research directions regarding GaN-based LEDs lies in the further understanding of the light emitting characteristics of GaN-based LEDs. Based on these knowledge, then, methods for enhancing GaN-based LEDs' lighting efficiency and brightness can be developed and discovered. These high-efficiency and high-brightness GaN-based LEDs would soon find their widespread application in outdoor display panels and automobile lamps.

The lighting efficiency of a GaN-based LED is mainly determined by the GaN-based LED's internal quantum efficiency and external quantum efficiency. The former relates to the probability of recombination of electrons and holes, thereby causing photons to be released, within the GaN-based LED's active layer. The more easily the electrons and holes are recombined, the more photons are released, and the higher the lighting efficiency of the GaN-based LED will be. The latter, on the other hand, relates to the probability of photons' successfully escape from the GaN-based LED without being absorbed or trapped inside. The more photons escape from the GaN-based LED, the higher the external quantum efficiency is, and the higher the lighting efficiency of the GaN-based LED will be.

The GaN-based LED's external quantum efficiency would, therefore, be affected by its index of refraction. Generally, the index of refraction of GaN-based LEDs is 2.5, higher than that of the atmosphere (which is 1). As such, total internal reflection would happen and photons released from the active layer would be trapped inside the GaN-based LEDs, significantly reducing the external quantum efficiency.

SUMMARY OF THE INVENTION

Therefore, the present invention provides an epitaxial structure for the GaN-based LEDs so that the limitations and disadvantages from the prior arts can be obviated practically.

The greatest difference between the GaN-based LEDs according to the present invention and the prior arts lies in the addition of a thin layer on top of the p-type contact layer within the traditional structure. The thin layer could be formed using silicon-nitride (SiN), or it could have a superlattice structure made of either SiN and undoped indium—gallium-nitride (InGaN), or SiN and undoped aluminum—gallium—indium—nitride (AlGaInN), respectively. Because of the use of SiN in the thin layer, the surfaces of the GaN-based LEDs would be micro-roughened, and the total internal reflection resulted from the GaN-based LEDs' higher index of refraction than the atmosphere could be avoided. The GaN-based LEDs according to the present invention therefore have superior external quantum efficiency and lighting efficiency.

The improvement in the GaN-based LEDs' lighting efficiency could be easily seen from FIG. 1. FIG. 1 is a characteristics graph showing, under different amount of injection current, the brightness measured from GaN-based LEDs according to the present invention and the prior arts. As shown in FIG. 1, the GaN-based LEDs with the aforementioned thin layer having a superlattice structure made of SiN and undoped $In_{0.2}Ga_{0.8}N$ apparently have a superior lighting efficiency than the GaN-based LEDs according to prior arts.

In addition, as the thin layer has a lower band gap than that of the traditional p-type contact layer, the interposition of the thin layer between the p-type contact layer below and the metallic electrode and transparent conductive layer above would have additional benefits, such as the resistivity between the thin layer and the electrode and conductive layer above is lower and, therefore, ohmic contact is easer to form.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The accompanied drawings are provided to illustrate the various embodiments of the present invention as described in this specification, so as to achieve better understanding of the major objectives of the present invention.

DETAILED DESCRIPTION OF THE PREFERRED EMBODIMENTS

In the following, detailed description along with the accompanied drawings is given to better explain preferred embodiments of the present invention. Please be noted that, in the accompanied drawings, some parts are not drawn to scale or are somewhat exaggerated, so that people skilled in the art can better understand the principles of the present invention.

Figure 1:
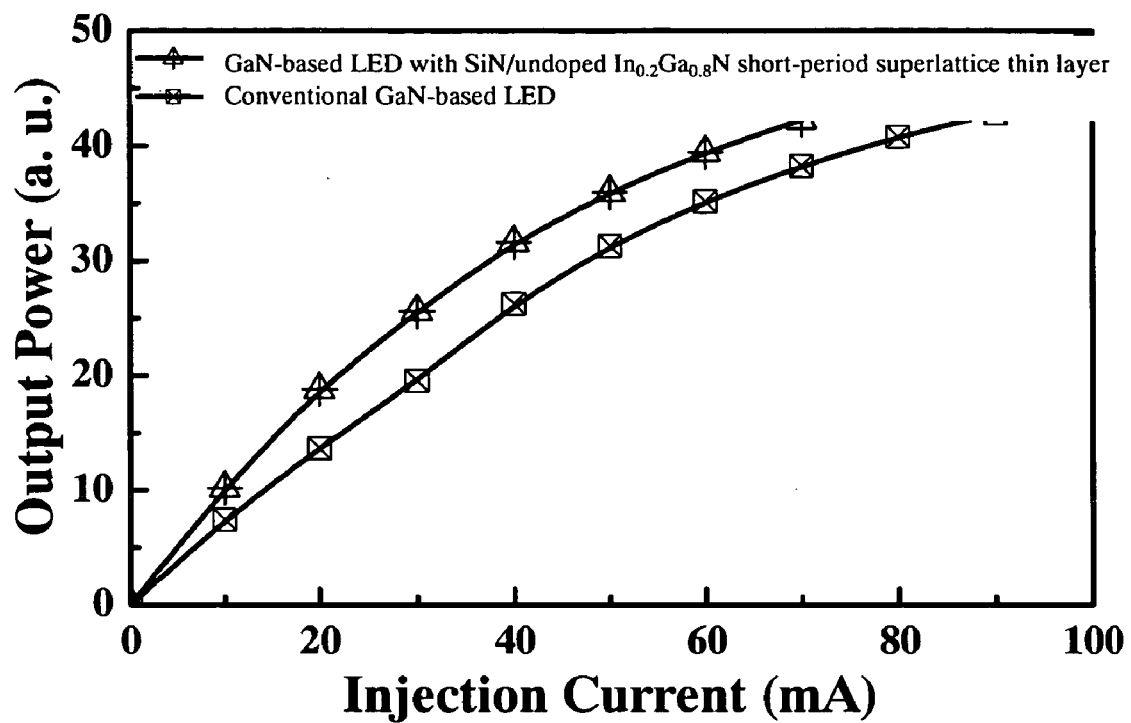
FIG. 1 is a characteristics graph showing, under different amount of injection current, the brightness measured from GaN-based LEDs according to the present invention and the prior arts.
Figure 2:
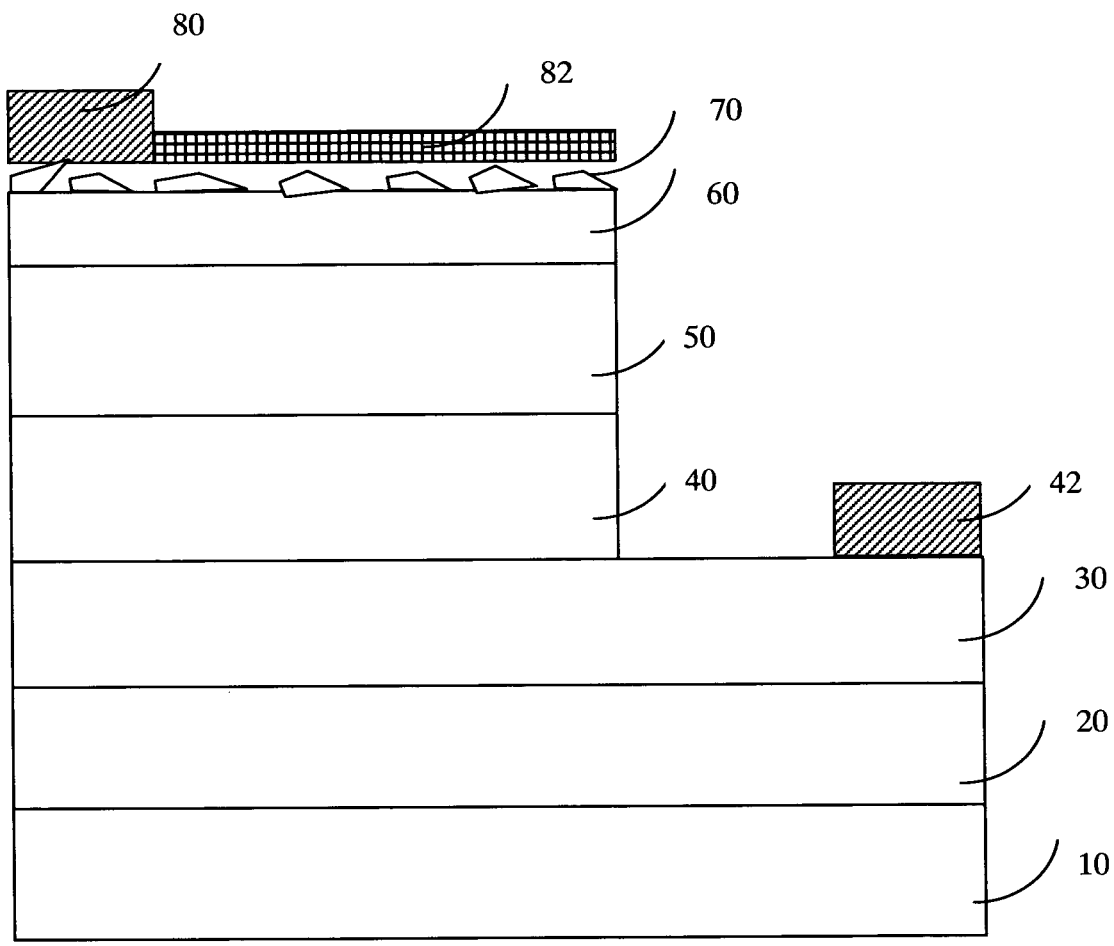
FIG. 2 is a schematic diagram showing the epitaxial structure of the GaN-based LEDs according to the first embodiment of the present invention.

FIG. 2 is a schematic diagram showing the epitaxial structure of the GaN-based LEDs according to the first embodiment of the present invention. As shown in FIG. 2, the GaN-based LED has a substrate 10 made of C-plane, R-plane, or A-plane aluminum—oxide monocrystalline (sapphire), or an oxide monocrystalline having a lattice constant compatible with that of nitride semiconductors. The substrate 10 can also be made of SiC (6H—SiC or 4H—SiC), Si, ZnO, GaAs, or $MgAl_2O_4$. Generally, the most common material used for the substrate 10 is sapphire or SiC. A buffer layer 20 made of $Al_aGa_bIn_{1-a-b}N$ ($0 \leq a, b < 1$, a+b≦1) having a specific composition is then formed on an upper side of the substrate 10. Then, an n-type contact layer 30 made of a GaN-based material is formed on the buffer layer 20. On top of the n-type contact layer 30, there are an active layer 40 made of InGaN and a negative electrode, not overlapping with each other.

The present embodiment then forms a p-type cladding layer 50 made of a p-type GaN-based material on top of the active layer 40. In turn, on top of the p-type cladding layer 50, there is a p-type contact layer 60 made of p-type GaN. Again, on top of the p-type contact layer 60, a micro-roughened thin layer 70, which is the key to the present invention, is formed. The micro-roughened thin layer 70 is made of $Si_dN_e$ (0<d, e<1), and has a thickness between 2 Å and 50 Å and a growing temperature between 600° C. and 1100° C.

Then, on top of the micro-roughened thin layer 70, there are a positive electrode 80 and a transparent conductive layer 82, which are not overlapping with each other. The positive electrode 80 is made of one of the materials including Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, $TiWN_x$ (x≧0), $WSi_y$ (y≧0), and other similar metallic materials. The transparent conductive layer 82 can be a metallic conductive layer or a transparent oxide layer. The metallic conductive layer is made of one of the materials including Ni/Au alloy, Ni/Pt alloy, Ni/Pd alloy, Pd/Au alloy, Pt/Au alloy, Cr/Au alloy, Ni/Au/Be alloy, Ni/Cr/Au alloy, Ni/Pt/Au alloy, Ni/Pd/Au alloy, and other similar materials. The transparent oxide layer, on the other hand, is made of one of the materials including ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, and $SrCu_2O_2$.

Figure 3:
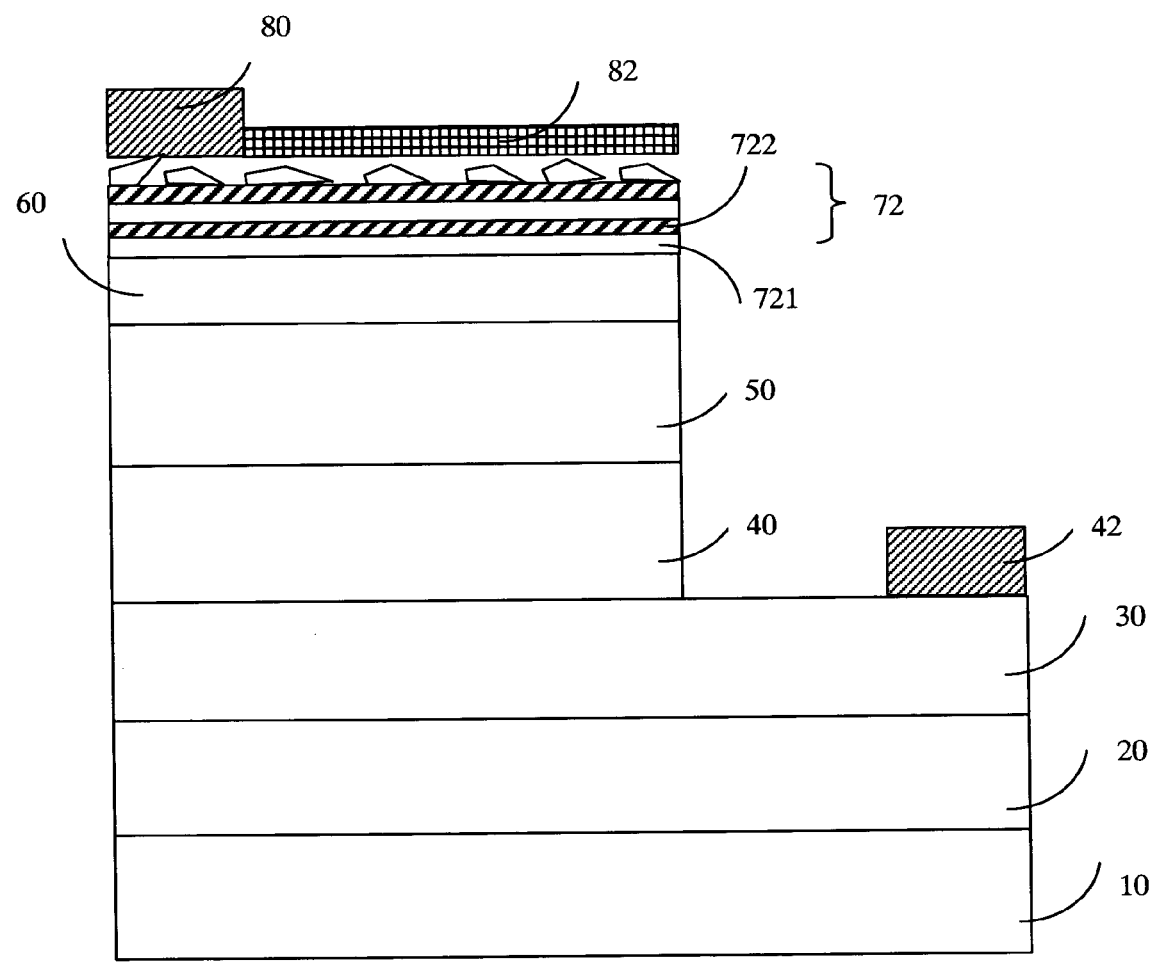
FIG. 3 is a schematic diagram showing the epitaxial structure of the GaN-based LEDs according to the second embodiment of the present invention.

FIG. 3 is a schematic diagram showing the epitaxial structure of the GaN-based LEDs according to the second embodiment of the present invention. As shown in FIG. 3, the present embodiment has an identical structure as in the previous embodiment. The only difference lies in the material and structure used for the micro-roughened thin layer. Within the present embodiment, the micro-roughened thin layer 72 has a short-period superlattice structure formed by alternately stacking a SiN thin layer 721 and an InGaN thin layer 722 on top of each other. Each of the SiN thin layers 721 is made of $Si_fN_g$ (0<f, g<1) having its specific composition (i.e., the parameters f, g are not necessarily identical to those of other SiN layers), and has a thickness between 2 Å and 20 Å and a growing temperature between 600° C. and 1100° C. On the other hand, each of the InGaN thin layers 722 is made of undoped $In_hGa_{1-h}N$ (0<h≦1) having its specific composition (i.e., the parameter h is not necessarily identical to that of other InGaN layers), and has a thickness between 2 Å and 20 Å and a growing temperature between 600° C. and 1100° C.

Within the micro-roughened layer 72, the bottommost layer (i.e., the one immediately above the p-type contact layer 60) could be a SiN thin layer 721. Then, on top of the bottommost SiN thin layer 721, an InGaN thin layer 722, another SiN thin layer 721, another InGaN thin layer 722, and so on, are sequentially and alternately stacked in this repetitive pattern. Alternatively, the bottommost layer could be an InGaN thin layer 722. Then, on top of the bottommost InGaN thin layer 722, a SiN thin layer 721, another InGaN thin layer 722, another SiN thin layer 721, and so on, are sequentially and alternately stacked in this repetitive pattern. The number of repetition is at least two (i.e., both the number of the SiN thin layers 721 and the number of the InGaN thin layers 722 are at least two). The overall thickness of the micro-roughened thin layer 72 should be less than 200 Å.

Figure 4:
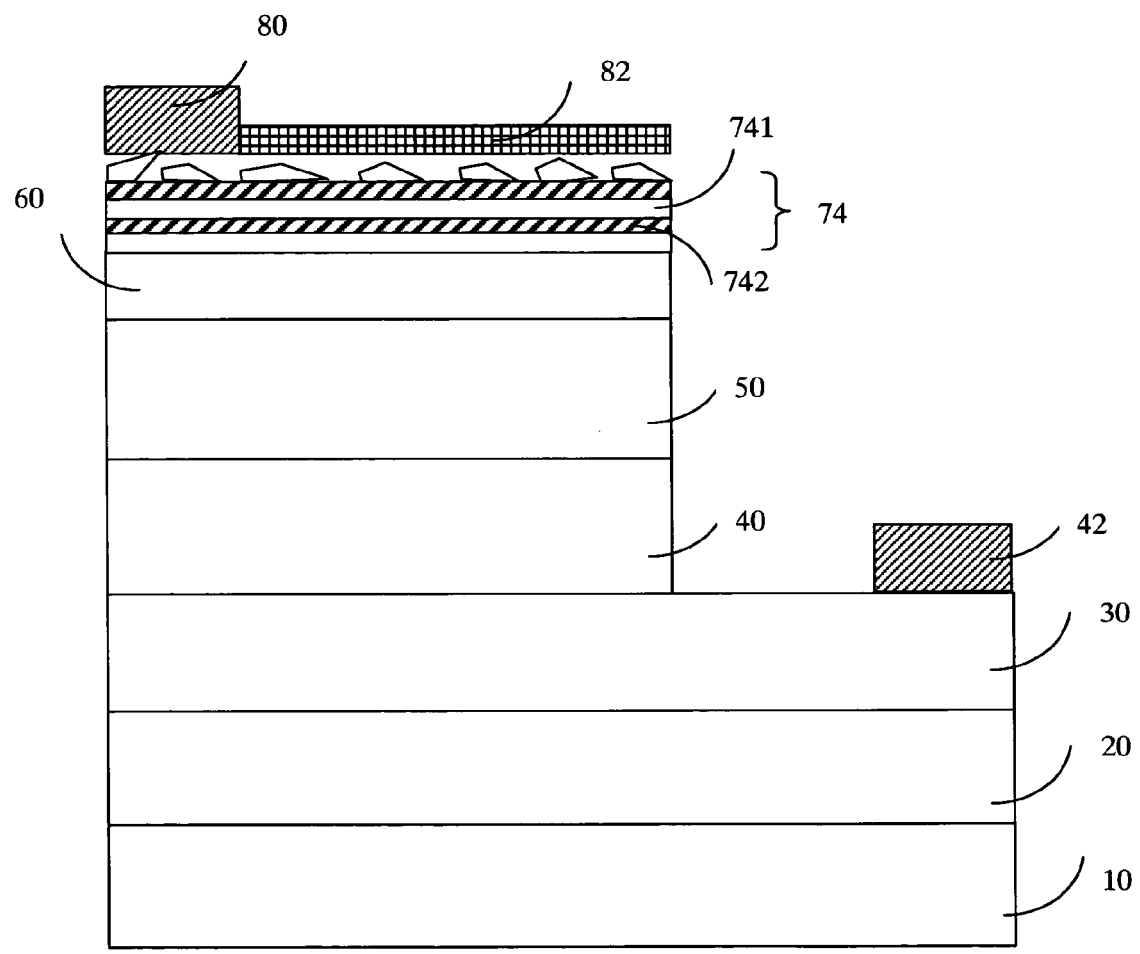
FIG. 4 is a schematic diagram showing the epitaxial structure of the GaN-based LEDs according to the third embodiment of the present invention.

FIG. 4 is a schematic diagram showing the epitaxial structure of the GaN-based LEDs according to the third embodiment of the present invention. As shown in FIG. 4, the present embodiment has an identical structure as in the previous embodiment. The only difference lies in the material and structure used for the micro-roughened thin layer. Within the present embodiment, the micro-roughened thin layer 74 has a short-period superlattice structure formed by alternately stacking a SiN thin layer 741 and an AlInGaN thin layer 742 on top of each other. Each of the SiN thin layers 741 is made of $Si_iN_j$ (0<i, j<1) having its specific composition (i.e., the parameters i, j are not necessarily identical to those of other SiN layers), and has a thickness between 2 Å and 20 Å and a growing temperature between 600° C. and 1100° C. On the other hand, each of the AlInGaN thin layers 742 is made of undoped $Al_mIn_nGa_{1-m-n}N$ (0<m, n<1, m+n<1) having its specific composition (i.e., the parameters m, n are not necessarily identical to those of other AlInGaN layers), and has a thickness between 2 Å and 20 Å and a growing temperature between 600° C. and 1100° C.

Within the micro-roughened layer 74, the bottommost layer (i.e., the one immediately above the p-type contact layer 60) could be a SiN thin layer 741. Then, on top of the bottommost SiN thin layer 741, an AlInGaN thin layer 742, another SiN thin layer 741, another AlInGaN thin layer 742, and so on, are sequentially and alternately stacked in this repetitive pattern. Alternatively, the bottommost layer could be an AlInGaN thin layer 742. Then, on top of the bottommost AlInGaN thin layer 742, a SiN thin layer 741, another AlInGaN thin layer 742, another SiN thin layer 741, and so on, are sequentially and alternately stacked in this repetitive pattern. The number of repetition is at least two (i.e., both the number of the SiN thin layers 741 and the number of the AlInGaN thin layers 742 are at least two). The overall thickness of the micro-roughened thin layer 74 should be less than 200 Å.

In aforementioned preferred embodiments of the present invention, the development of the SiN material within the micro-roughened thin layer would cause the surfaces of the GaN-based LEDs to be micro-roughened. As such, the total internal reflection resulted from the GaN-based LEDs' higher index of refraction than the atmosphere could be avoided. The GaN-based LEDs according to the present invention therefore have superior external quantum efficiency and lighting efficiency.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A GaN-based LED structure, comprising:
   a substrate made of a material selected from the group consisting of sapphire, 6H—SiC, 4H—SiC, Si, ZnO, GaAs, $MgAl_2O_4$, and an oxide monocrystalline having a lattice constant compatible with those of nitride semiconductors;

a buffer layer made of $Al_aGa_bIn_{1-a-b}N$ ($0 \leq a,b<1$, $a+b \leq 1$) having a specific composition located on top of an upper side of said substrate;

an n-type contact layer made of a GaN-based material located on top of said buffer layer;

an active layer made of InGaN located on top of said n-type contact layer;

a negative electrode located on top of a part of said n-type contact layer, not overlapping with said active layer;

a p-type cladding layer made of a p-type GaN-based material located on top of said active layer;

a p-type contact layer made of p-type GaN located on top of said p-type cladding layer;

a micro-roughened thin layer made of a material having SiN as a constituent located on top of said p-type contact layer;

a transparent conductive layer selected from the group consisting of a metallic conductive layer and a transparent oxide layer, located on top of a part of said micro-roughened thin layer's upper surface, wherein said metallic conductive layer is made of a material selected from the group consisting of Ni/Au alloy, Ni/Pt alloy, Ni/Pd alloy, Pd/Au alloy, Pt/Au alloy, Cr/Au alloy, Ni/Au/Be alloy, Ni/Cr/Au alloy, Ni/Pt/Au alloy, and Ni/Pd/Au alloy, and said transparent oxide layer is made of a material selected from the group consisting of ITO, CTO, ZnO:Al, $ZnGa_2O_4$, $SnO_2$:Sb, $Ga_2O_3$:Sn, $AgInO_2$:Sn, $In_2O_3$:Zn, $CuAl_{O2}$, LaCuOS, NiO, $CuGaO_2$, and $SrCu_2O_2$; and a positive electrode located on top of another part of said micro-roughened thin layer's upper surface not covered by said transparent conductive layer, made of a material selected from the group consisting of Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, $TiWN_x$ ($x \geq 0$), and $WSi_y$ ($y \geq 0$).

2. The GaN-based LED structure as claimed in claim 1, wherein said micro-roughened thin layer is made of $Si_dN_e$ ($0<d, e<1$) and has a thickness between 2 Å and 50 Å.

3. The GaN-based LED structure as claimed in claim 1, wherein said micro-roughened thin layer has a short-period superlattice structure formed by alternately stacking a SiN thin layer and an InGaN thin layer on top of each other repetitively for at least two times, said micro-roughened thin layer has an overall thickness at most 200 Å, each of said SiN thin layers is made of $Si_fN_g$ ($0<f, g<1$) having a specific composition respectively and has a thickness between 2 Å and 20 Å, and each of said InGaN thin layers is made of undoped $In_hGa_{1-h}N$ ($0<h \leq 1$) having its specific composition respectively and has a thickness between 2 Å and 20 Å.

4. The GaN-based LED structure as claimed in claim 1, wherein said micro-roughened thin layer has a short-period superlattice structure formed by alternately stacking a SiN thin layer and an AlInGaN thin layer on top of each other repetitively for at least two times, said micro-roughened thin layer has an overall thickness at most 200 Å, each of said SiN thin layers is made of $Si_iN_j$ ($0<i, j<1$) having a specific composition respectively and has a thickness between 2 Å and 20 Å, and each of said AlInGaN thin layers is made of undoped $Al_mIn_nGa_{1-m-n}N$ ($0<m, n<1$, $m+n<1$) having its specific composition respectively and has a thickness between 2 Å and 20 Å.

* * * * *